United States Patent [19]

Martin et al.

[11] Patent Number: 5,629,522

[45] Date of Patent: May 13, 1997

[54] APPARATUS FOR AND METHOD OF PROVIDING LONG INTEGRATION TIMES IN AN IR DETECTOR

[75] Inventors: Robert J. Martin, Orlando; Kirk Reiff, Titusville; Mark West, Oviedo; Gregory L. Milne, Casselberry; Kevin Brown, Orlando, all of Fla.

[73] Assignee: Martin Marietta Corporation, Bethesda, Md.

[21] Appl. No.: 487,682

[22] Filed: Jun. 7, 1995

[51] Int. Cl.⁶ .................. H01L 27/14; G01J 5/20
[52] U.S. Cl. .................. 250/338.4; 250/370.01; 250/340; 257/21; 257/23
[58] Field of Search .................. 250/338.4, 370.08, 250/370.01, 340, 332; 257/14, 24, 21

[56] References Cited

U.S. PATENT DOCUMENTS

| | | |
|---|---|---|
| 4,684,812 | 8/1987 | Tew et al. . |
| 4,686,373 | 8/1987 | Tew et al. . |
| 4,692,618 | 9/1987 | Klatt . |
| 4,903,181 | 2/1990 | Maserjian .................. 357/30 |
| 5,049,752 | 9/1991 | Kalaf et al. . |
| 5,182,446 | 1/1993 | Tew . |
| 5,228,072 | 7/1993 | Ingalsbe et al. .................. 379/21 |
| 5,268,576 | 12/1993 | Dudley .................. 250/332 |
| 5,326,984 | 7/1994 | Rosencher et al. .................. 250/338.4 |
| 5,442,984 | 8/1995 | Eckle, Jr. et al. .................. 250/338.4 |

*Primary Examiner*—Michael J. Tokar
*Assistant Examiner*—Virgil O. Tyler
*Attorney, Agent, or Firm*—Burns, Doane, Swecker & Mathis, L.L.P.

[57] ABSTRACT

Apparatus for and method of increasing the effective integration time, and, hence, reducing the noise bandwidth of a photodetector. The current output of the photodetector is converted to a voltage signal in a low pass filter. The low pass filter is preferably implemented as a switched capacitor filter.

10 Claims, 11 Drawing Sheets

APPARATUS FOR AND METHOD OF PROVIDING LONG INTEGRATION TIMES IN AN IR DETECTOR

BACKGROUND

The present invention is an apparatus for and method of providing long integration times in an IR detector. Such detectors are useful, for example, in night vision equipment as well as for use as cells on forward looking infrared (FLIR) staring focal plane arrays. Such detectors are also useful in detecting wind shear, $CO_2$ monitoring, respiration monitoring, and visible astronomy. The invention is particularly useful when the detector is a quantum well infrared photodetector.

Recently, semiconductor structures that have dimensions small enough to make quantum mechanical effects important have been described in the literature, e.g., M. Sundaram et al., "New Quantum Structures", Science, Vol. 254, pp. 1326–35 (Nov. 29, 1991). Conventional quantum well infrared photodetectors (QWIPs) respond to thermal radiation with an increase in electrical conductivity that results from internal photoemission of charged carriers from energy states confined in quantum wells. Typical materials used for conventional QWIPs are III-V compound semiconductors such as gallium arsenide and aluminum gallium arsenide. A typical QWIP is a stack of layers in which the layers' materials and widths are carefully selected to achieve a desired distribution of energy states for the device's electrons. See, e.g., B. Levine et al., "New 10 µm Infrared Detector Using Intersubband Absorption in Resonant Tunneling GaAlAs Superlattices", Appl. Phys. Lett., Vol. 50, pp. 1092–1094 (Apr. 20, 1987).

The Levine et al. paper describes an example of the energy states in a conventional, unbiased QWIP. The wells have widths and energy depths that are chosen to provide two confined states, namely, a ground state and an excited state. The energy separation between the ground state and the excited state is set equal to the energy of the photon to be detected by the QWIP, and generally increases as the width of the layers corresponding to the quantum wells decreases. The well layers are doped with electron donor impurities, e.g., silicon, thereby partially filling the lowest energy state with electrons. Barriers having thicknesses of typically one hundred Angstroms (100 Å) separate the quantum wells.

QWIPs have many areas of potential usefulness. Considering the use of a QWIP in a night vision camera, for example, one of the defining figures of merit is the noise equivalent temperature. This figure of merit specifies the minimum observable temperature which the camera can resolve.

The noise equivalent temperature is inversely related to the amount of integration time $t_i$ that is available. This can be shown by an analysis of the detector root mean square noise and the equivalent scene dependent current equation. If photovoltaic detectors such as mercury-cadmium-telluride are used then the noise is found from the expression:

Noise Bandwidth $f_n$:

$$f_n = \int_0^\infty \frac{\sin(\pi f t_i)}{\pi f t_i} df = \frac{1}{2t_i} \text{ Hertz}$$

Noise Current $<i_n>$ for photovoltaics:

$$<i_n> = \sqrt{\frac{2qI_{DC}}{t_i}} \text{ amperes rms}$$

where q is the electron charge ($e^- = 1.6 \times 10^{-19}$ coulombs) and $I_{DC}$ is the average current. (For photoconductors, the factor of two under the square root sign becomes 4 g, where g is the photoconductive gain.)

The noise equivalent current depends on the background photon flux. The photon flux is found from Planck's blackbody emittance equation. This classic relationship is:

$$\Phi(T) = \int_{\lambda_l}^{\lambda_h} \frac{2c}{\lambda^4 \left(e^{\frac{hc}{\lambda kT}} - 1\right)} d\lambda \frac{\text{photons}}{\text{cm}^2\text{-sec-}Sr}$$

where:

$\Phi(T)$=photon flux in photons/sec/cm²/Sr

T=temperature in Kelvin h=$6.625 \times 10^{-34}$ joule-sec k=$1.38 \times 10^{-23}$ joule/Kelvin c=$3 \times 10^{10}$ cm/sec λ=wavelength in cm $\lambda_h$=upper or longest wavelength band edge in cm $\lambda_l$=lower or shortest wavelength band edge in cm.

For $\lambda_h$ and $\lambda_l$, the band edge is taken as the half power point of the curve, that is, the fifty percent point in responsivity.

The photon flux converts to current in a detector that has a suitable energy gap. The longer wavelengths require smaller energy gaps. The smaller energy gap allows the low energy photons to dislodge the electrons and permit current flow. The relevant flux to current equation for photovoltaics is:

$$i_p(T) = \eta q A \Omega_r \tau_o \Phi(T) \text{ amperes}$$

where:

$i_p(T)$ is the photocurrent in amperes q is the electron charge ($1.602 \times 10^{-19}$ coulombs)

$\Omega_r$ is the solid angle $\pi/(2F\#)^2 = \pi/16$ for F#=2 (typical)

A is the effective detector area=$16 \times 10^{-6}$ cm²

$\tau_o$ is the optical transmission efficiency (0.5 typical)

η the conversion efficiency (0.8 typical) electrons/photon.

Again, for photoconductors, the expression on the right is multiplied by a factor of g representing the photoconductive gain.

The flux used here is actually the difference between the flux found at one degree above the background and the flux at the background, divided by one degree times the noise equivalent temperature. Using 300 Kelvin as a reference and setting the electronic noise current equal to the noise equivalent temperature yields the desired relationship. In addition, the direct current is related to the integration time because:

$$I_{DC} = \frac{V_m C_w}{t_i} \text{ amperes}$$

where:

$V_m$ is the maximum voltage swing (5 volts typical)

$C_w$ is the well capacity in farads.

The noise becomes:

$$\langle i_n \rangle = \frac{\sqrt{2qV_mC_w}}{t_i} \text{ amperes rms}$$

$$\frac{\sqrt{2qV_mC_w}}{t_i} = \eta q A \Omega_r T_{ne} \frac{\delta\phi(T)}{\delta T} \tau_0 \text{ amperes}$$

Thus, $$a/t_i = T_{ne} \text{ Kelvin}$$

where $T_{ne}$ is the noise equivalent temperature and $$a = \frac{\sqrt{2qV_mC_w}}{\eta q A \Omega_r \frac{\delta\phi(T)}{\delta T} \tau_0} \text{ Kelvin-seconds}$$

The inverse proportionality constant between the integration time and the noise equivalent temperature is thus limited by the well capacity. The well capacity is limited by the IC chip area which is set by the dimensions and spacing of the detector elements. There are thus imposing physical constraints on the range of possibilities for decreasing the noise equivalent temperature. First, the solution cannot use complicated circuitry as there is limited space available to implement the circuit and even less interconnection wiring space available. Secondly, the solution cannot introduce any additional source of noise.

The above analysis concerns itself primarily with photovoltaics. The analysis with respect to photoconductors is substantially the same except that, as noted, photoconductive gain needs to be factored in.

One attempted solution is described in U.S. Pat. Nos. 4,684,812 and 4,686,373 entitled "Switching Circuit for a Detector Array and Infrared Imager" in the name of Tew et al. This technique uses a pair of capacitors. The second capacitor is used to average the ramp and dump cycle of the first capacitor. However, the first capacitor is not reset and starts with the same initial value of charge as the averaging capacitor. Thus, the amount of filtering depends only on the absolute value of the averaging capacitor. Mathematically, the Tew technique is $$C_{eq} = C_w + C_a \text{ farads}$$

where:

$C_w$ is the well capacitance $C_a$ is the averaging capacitor.

Obviously, the equivalent capacitor depends on the absolute value of the added averaging capacitor.

There remains a need for a method and means by which effective integration times can be increased within the space available on the chip without introducing noise.

SUMMARY

These and other objects of the invention are achieved in the present invention, in which a synchronous low pass filter is used to sum up sequential integration flames in a manner which effectively prolongs integration times and narrows the equivalent noise bandwidth. The method according to the present invention can extend the equivalent charge well capacity and so integration time by a factor of as much as twenty times standard performance, narrows the noise bandwidth and yields improvement in the signal-to-noise ratio of a factor of as much as 4.6.

The system facilitates two color (mid to long wave) operation in that, the long wave has 17 times more photons per unit area and the same bandwidth as the short. By returning the deep well to a shallow well the voltage gain for both bands is balanced. Testing also is facilitated because the measured time constant for the low pass filter quantifies the well depth and channel gain.

These and other advantages are realized in the present invention through provision of a device comprising first means, arranged to receive a flux of photons, for generating a first current signal in response to said flux of photons, and second means, responsive to said first current signal, for generating a first voltage signal in response to said first current signal, said second means including a low pass filter. The first means advantageously comprises a quantum efficient detector, more specifically, a quantum well infrared photoconducting detector. The low pass filter is preferably a switched capacitor low pass filter.

In another aspect, the invention is a device comprising first means, including a quantum well infrared photoconducting detector arranged to receive a photon flux, for generating a current signal having a magnitude indicative of an intensity of the photon flux, and means arranged to be charged by the current signal for generating a voltage signal as a result of being charged, the voltage signal having a magnitude indicative of the magnitude of the current signal, the means including a switched capacitor low pass filter.

In yet another aspect, the invention comprises first means, including a quantum well infrared photoconducting detector arranged to receive a photon flux, for generating a current signal having a magnitude indicative of an intensity of said photon flux, a first capacitive structure which is charged by the current signal, and a second capacitive structure. A first transistor switch having a first conduction interval is arranged between the first capacitive structure and the second capacitive structure to transfer a charge accumulated by the first capacitive structure to the second capacitive structure. It also includes a third capacitive structure and a second transistor switch having a second conduction interval having no substantial overlap with the first conduction interval. The second switch transistor is arranged between the second capacitive structure and the third capacitive structure to transfer a charge accumulated by the second capacitive structure to the third capacitive structure.

A device according to the invention preferably has three capacitive structures. The first is a charge well that is reset every cycle. The second capacitive structure transfers a charge to be time averaged to the third capacitive structure. The time averaging depends on the ratio of the third capacitive structure to the second and not the absolute value of the averaging capacitive structure. This allows the use of a much smaller silicon chip area for the same effective noise reduction. It is thus possible to avoid the need for a large absolute value for the capacitor to achieve noise averaging.

In another aspect, the invention is a method comprising the steps of generating a first current signal in response to a flux of photons and generating a first voltage signal in response to said first current signal using a low pass filter. The step of generating a first voltage signal in response to said first current signal using a low pass filter may comprise using a switched capacitor low pass filter.

In another aspect, the invention comprises a technique for significantly reducing the equivalent noise bandwidth of an infrared focal plane array readout circuit.

The invention is also a method comprising the steps of generating a current signal having a magnitude indicative of an intensity of a photon flux using a quantum well infrared photoconducting detector arranged to receive said photon flux and generating a voltage signal as a result of charging by said current signal, said voltage signal having a magnitude indicative of said magnitude of said current signal, using a switched capacitor low pass filter.

The invention allows a noise filter to be added to the staring array cell. This low pass noise filter narrows the noise bandwidth. Narrowing the noise bandwidth allows the long wave length infrared quantum well focal plane array to operate at higher temperatures without the use of an electromechanical chopper.

BRIEF DESCRIPTION OF THE DRAWINGS

The invention and its objects and advantages will be understood from the following detailed description and the accompanying drawings, in which.

DETAILED DESCRIPTION

Switched capacitor networks have been highly developed for telephonic communication system applications. The implementation of this technology other than as a simple current to voltage converter has lagged behind for infrared systems. A simple dump, ramp, and sample current-to-voltage converter can be combined with a second well to produce a low pass switched capacitor filter.

Figure 1:
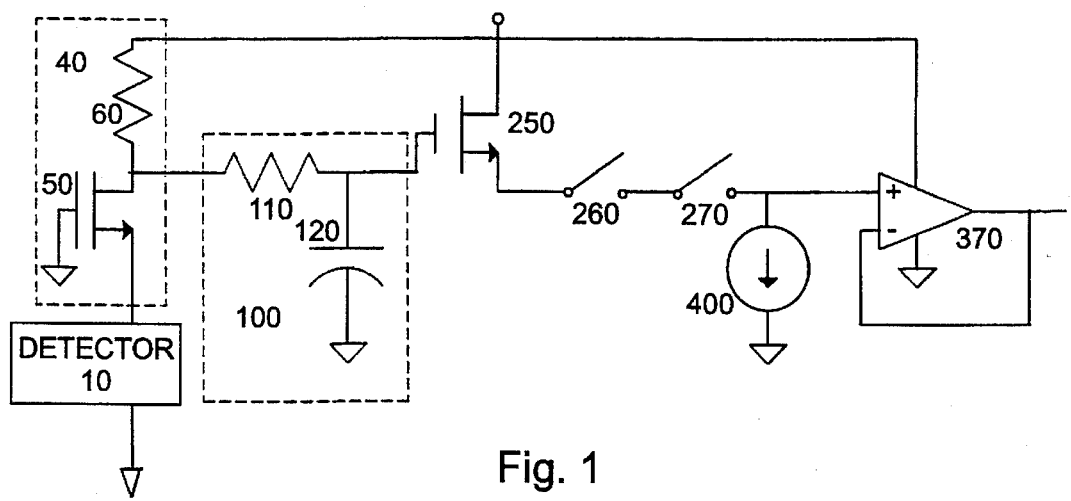
FIG. 1 is a functional schematic of an arrangement according to one embodiment of the invention.

FIG. 1 is a functional rendering of a circuit according to the present invention. The circuit is designed to serve as one cell in a detector array, but it will be understood by one of ordinary skill in the art that circuits embodying the invention will be suitable for other applications as well. The circuit includes a detector 10. The detector 10 is a photon counter that basically converts photons per second into amperes. The balance of the circuit may be considered as a multiplexer which must convert the detector current signal into a voltage signal and time division multiplex many voltage signals to a single output line or port.

The detector 10 is connected in series with a buffer injector 40. In the functional circuit, the buffer injector 40 is depicted as a series combination of an n channel transistor 50 and a resistor 60. The buffer injector 40 carries out the first major task of the multiplexer which is to buffer the photoconducting quantum well cell. This means that this circuit keeps the voltage across the detector 10 constant while the voltage across the downstream circuitry may have a large swing. The buffer injector 40 should also have very low input impedance and large output impedance. Satisfying these conditions means that the input to the next stage "looks like" an ideal current source.

This type of performance is achieved with unity current gain and a large voltage gain. In amplifier theory, this class of performance is produced by a common gate amplifier circuit. The common gate amplifier has the gate grounded and the detector is electrically connected to the source. The charge well is connected to the drain. The input impedance is the transconductance of the transistor. The voltage gain is the ratio of the transconductance to the output conductance of the amplifier.

The transistor which serves as buffer injector 40 is in its own well to prevent back gate currents from biasing the detector. In addition, placing the transistor in its own well prevents thermal blooming should the local detector be inadvertently shorted to the detector bias line. This transistor operates in the subthreshold mode which implies a large and constant voltage gain. The length of the transistor is not held at minimum to avoid short gate effects.

The current signal from the buffer injector 40 as it tries to maintain the voltage across the detector 10 constant is filtered by a low pass filter 100, represented in the figure as a resistor 110 and a capacitor 120. In doing so, the low pass filter carries out the second major task of the multiplexer, which is to convert the input signal current into a voltage. The classic current to voltage converter is, of course, a resistor. In cases such as that presented here, where an input current and the output voltage are time varying signals, the conversion is called a transfer resistance. As set forth below, due to the need to take up a small an area as possible, and also for time programmability, switched capacitor technology is used to make a capacitor act like a resistor. Briefly, this is accomplished by periodically sampling the capacitor's voltage and subsequently dumping the capacitor's charge to repeat the ramp and dump cycle.

It is also desirable for the reasons set forth above to limit the noise bandwidth of the multiplexer. This is also accomplished by the low pass filter, and can also be implemented by a switched capacitor low pass filter. The implementation of the low pass filter takes up orders of magnitude less silicon chip area than does limiting the noise bandwidth using a large charge well.

The output of the low pass filter 100 is buffered by a cell buffer represented as an n channel transistor 250. The cell buffer isolates the large impedance of the transfer resistance from the high speed time division multiplexer represented as row switch 260 and column switch 270 in FIG. 1. The time division multiplexer addresses every cell in the array to read out the filtered signal voltage for that frame.

If the multiplexer permits, the signal reaches an output buffer 370, shown as an operational amplifier. The output buffer 370 isolates the time division multiplexer from the relatively large external capacitive load. This isolation provides the speed needed to read out large arrays efficiently. The output buffer is provided current by current source 400.

The detector 10 may be of the type disclosed in commonly owned, copending application Ser. No. 08/477,434, entitled "Anti-Blooming Detector Array Circuit", in the names of Robert J. Martin and Kevin L. Brown, filed on even date herewith and hereby incorporated by reference.

The concept underlying the invention will now be explained. The noise equivalent bandwidth for resistor capacitor filters of the type is:

$$f_n = \frac{1}{4RC_f} \text{ Hertz}$$

where $C_f$ is the filter capacitance and $$t_i = \frac{1}{2f_n} = 2RC_f \text{ seconds}$$

where $V_m$ is the maximum voltage swing, $C_w$ is the well capacity, and $C_R$ is the resistor capacitance.
where $$R = \frac{V_m C_w}{C_R I_{DC}} \text{ ohms}$$

then $$t_i = \frac{2V_m C_w C_f}{C_R I_{DC}} \text{ seconds}$$

This new formulation has a capacitor ratio rather than an absolute requirement. This ratio can be implemented with a value of ten to one. Now, if the well capacity is divided between the filter and the integration accumulator functions then one finds that the integration time can be extended by a factor of twenty to one. This advantage can yield up to 4.46 times better noise equivalent temperatures (NEΔT).

Figure 2:
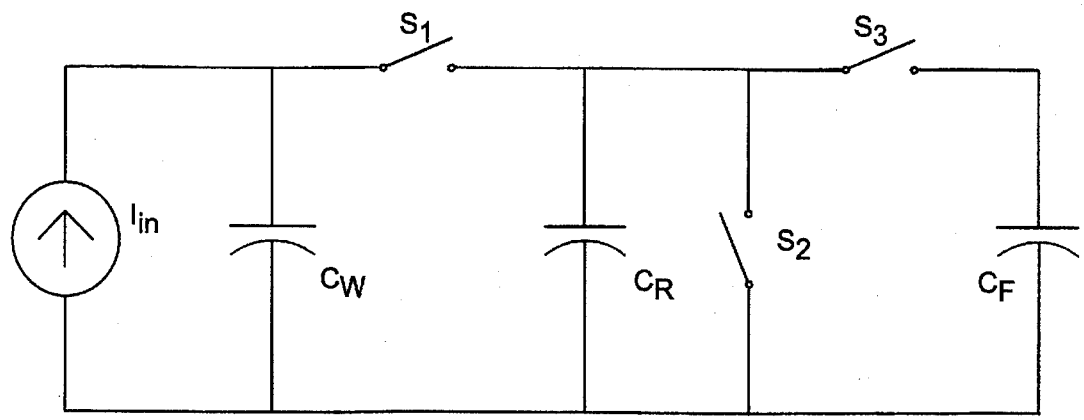
FIG. 2 illustrates operation of a switched capacitor filter.

The invention preferably uses a synchronous switched capacitor low pass filter. A switched capacitor low pass noise filter readout circuit has been demonstrated in a 64×64 element array. Measured data shows the well capacity increased by twenty times and the noise was reduced by a factor of four. This matched predicted results. The network under analysis is shown in the FIG. 2. This network consists of a dump, ramp, and sample switched capacitor current to voltage converter comprised of capacitors $C_w$ and $C_R$ and a low pass switched capacitor filter composed of $C_R$ and $C_F$.

This circuit operates as follows. All of the capacitors are set to an initial condition of zero volts by turning on all three of the switches. Opening $S_2$ and $S_3$ starts the charge accumulation ramp cycle. Current flows from the buffered injector and accumulates charge on the well capacitor $C_w$ plus the equivalent switched capacitor resistor or transfer capacitor $C_R$. The resultant voltage waveform across the well capacitor is a sawtooth waveform. At the end of the sub-integration time period, the charge accumulated on the transfer capacitor $C_R$ is isolated from $C_W$ by opening switch $S_3$. The transfer of charge from $C_R$ to $C_F$ is controlled by the conduction of switch $S_3$. Next, the transfer capacitor is isolated from the filter capacitor $C_F$ by opening $S_3$. Subsequently, $S_1$ and $S_2$ conduct to reset the voltage of $C_R$ and $C_w$ to zero volts. At this point $S_2$ and $S_3$ are opened to restart the charge accumulation ramp cycle. After a large number of charge transfers to the filter capacitor (typically 20–60), the output is sampled. Finally, all three switches conduct to end the total charge accumulation cycle and restart the process.

The small transfer capacitor $C_R$ in the low pass switched capacitor filter is often called the cup and the large capacitor $C_F$ called a bucket. A typical bucket to cup ratio lies between ten and twenty to one. This range has been empirically determined and depends on the parasitic capacitances. For this switched capacitor filter there could be as many as 64 scoops of the cup to fill a bucket to the point where the step size between scoops is less than twelve bits per scoop.

The sub-integration part of the process described above is the accumulation of charge on $C_R$ and $C_w$. In the time domain, this may be described mathematically by the integral of the current as related to the capacitor voltage in the time domain. The voltage on the capacitor for integration time $t_i$ is given by $$v_1(t) = \frac{1}{C_w + C_R} \int_0^{t_i} i_{in}(\tau) d\tau \text{ volts}$$

where $v_1(t)$ is the voltage across the two parallel connected capacitors
 $t_i$ is the integration time in seconds
 $i_{in}$ is the current flowing from the detector through the buffering injector into the capacitors in amperes.

Figure 3:
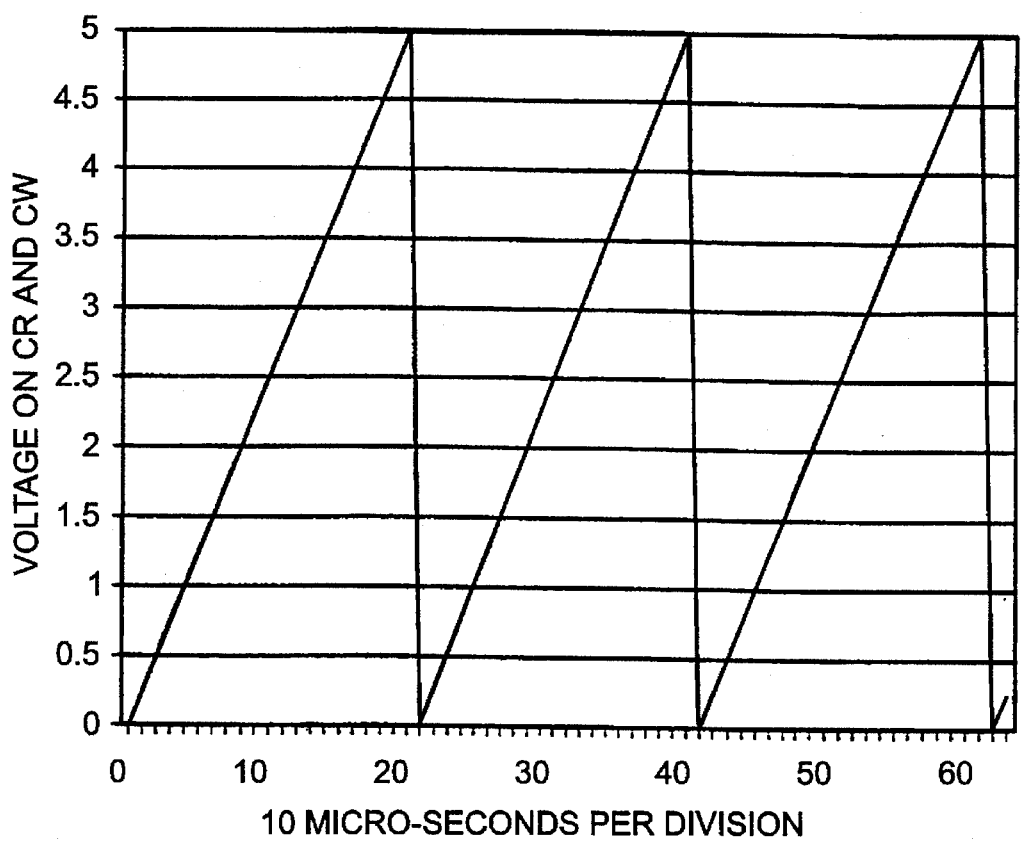
FIG. 3 is an exemplary waveform as might be produced from an arrangement such as that shown in FIG. 2.

The sawtooth voltage resulting from this integration process is shown in FIG. 3. This voltage is the sawtooth time domain waveform of the charge accumulation process for the well capacitor in parallel with the cup capacitor of the low pass filter.

If the system is stationary in the wide sense then the current is considered to be relatively constant over several integration periods (0.008 seconds is the typical limit before motion artifacts become evident). If the current is constant over the integration period then the resulting voltage samples become $$v_1(t_i) = \frac{t_i I_{IN}}{C_w + C_R} \text{ rect}(t/t_i) \text{ volts}$$

where $\text{rect}(t/t_i) = 1$, $0 < t \leq t_i$
 0, else
 $t_i$ is the integration time in seconds
 $I_{IN}$ is the quasi-stationary input current.

Figure 4:
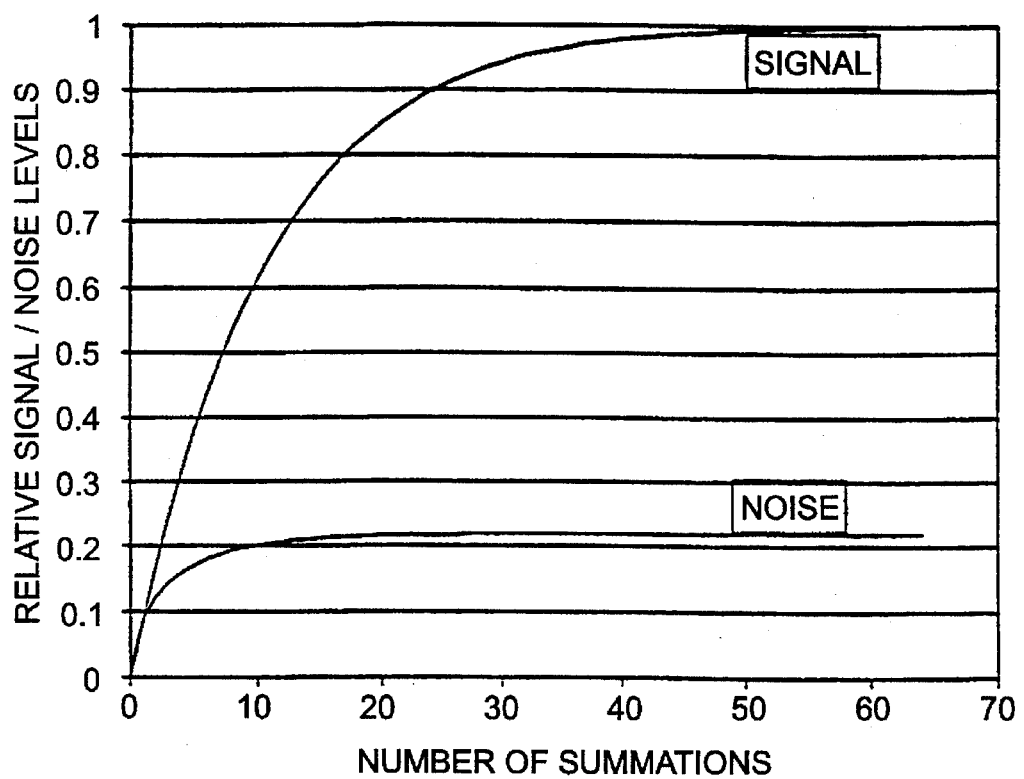
FIG. 4 shows relative signal to noise levels in an arrangement such as that shown in FIG. 2.

The time domain behavior of the cup and bucket summation process is shown for a 64 step process in FIG. 4. By an induction process based on zero initial conditions, a discrete difference mode equation can be solved. This equation describing the relationship between the output and input voltage summation process is described by a discrete equation as follows:

$$v_{out}(k) = v_{in}*(C_R/C_F)* \sum_{k=1}^{n} (1 + C_R/C_F)^{-k} \text{ volts}$$

where k is an integer index, k=1,2,3, . . . ,n
 n is the number of summations

The noise summation is taken as the root of the weighted sums of the squares of the samples. This is written in discrete form as the equation $$v_{no}(k) = v_{ni}*(C_R/C_F)* \left( \sum_{k=1}^{n} (1 + C_R/C_F)^{-2k} \right)^{.5} \text{ volts}$$

where the index 2k provides the square function.

A comparison of the correlated weighted sum of the signal samples and the root of the sum of the squares of the noise is shown in FIG. 4. This plot constitutes the time domain representation of the cup and bucket switched capacitor low pass bandwidth limiting noise filter. The capacitor ratio used in the plot was ten to one for $C_F$ and $C_R$ respectively.

Figure 5:
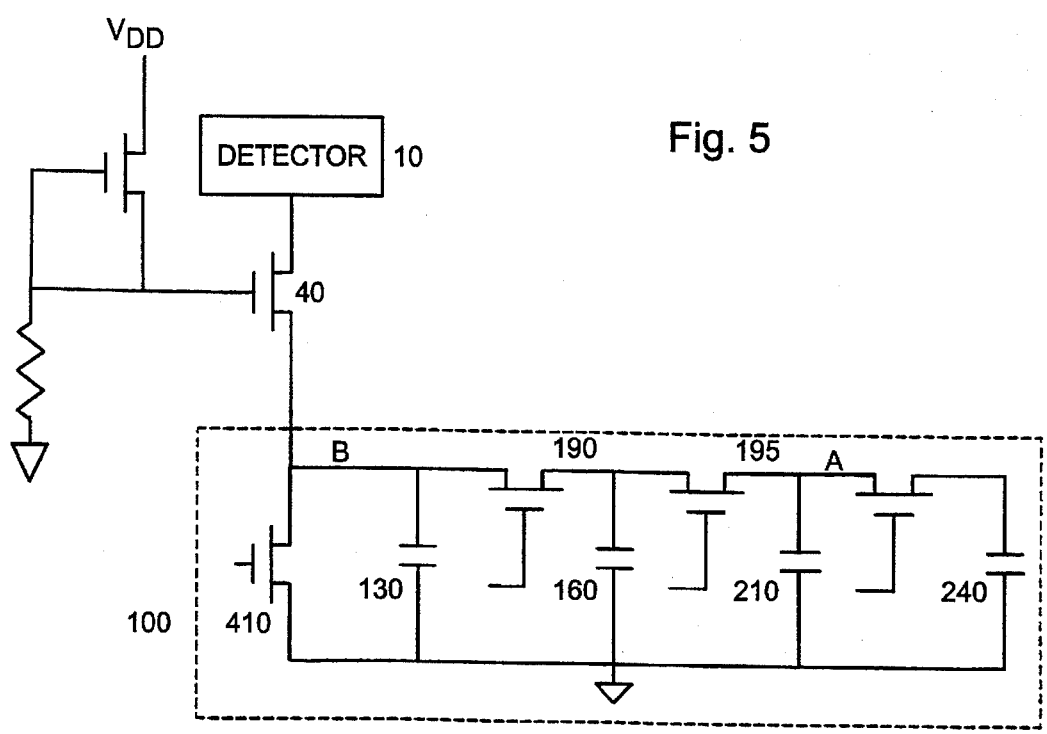
FIG. 5 is a circuit diagram of an implementation of an embodiment of the invention as one cell in an array.

A rendering of a circuit incorporating a switched capacitor filter in a detector cell is shown in FIG. 5. The detector 10 is again connected in series with a buffer injector 40. The buffer injector is a common gate amplifier that keeps the voltage across the detector constant while the voltage across the capacitors ramps.

The current signal from the buffer injector 40 as it tries to maintain the voltage across the detector 10 constant is filtered by a low pass filter 100, represented in FIG. 5 as a series of capacitors connected in parallel. As will be explained below, these capacitors are preferably implemented as MOSFET gate structures.

Figure 6:
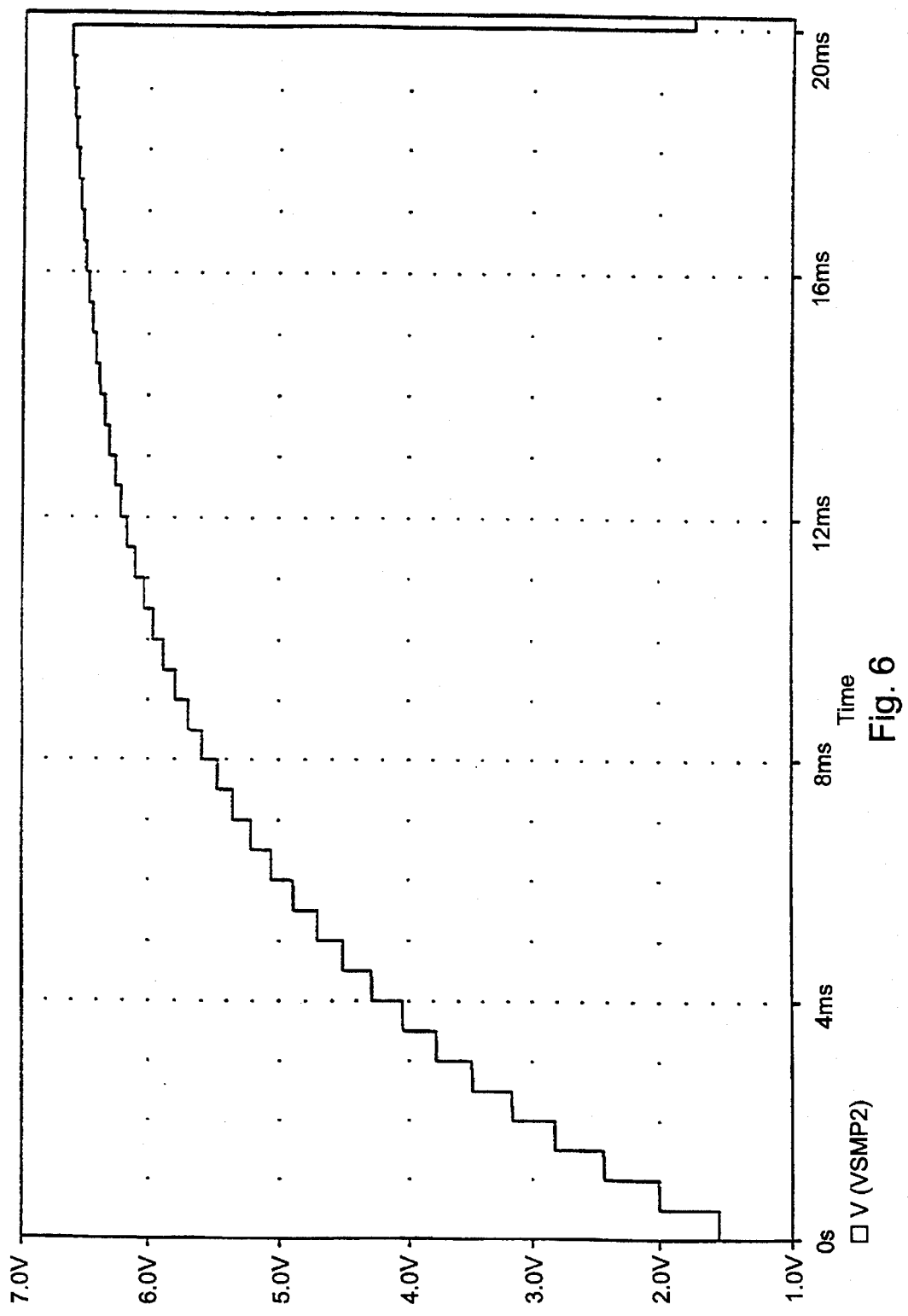
FIGS. 6 and 7 depict waveforms as would occur at various points in the embodiment of FIG. 5.
Figure 7:
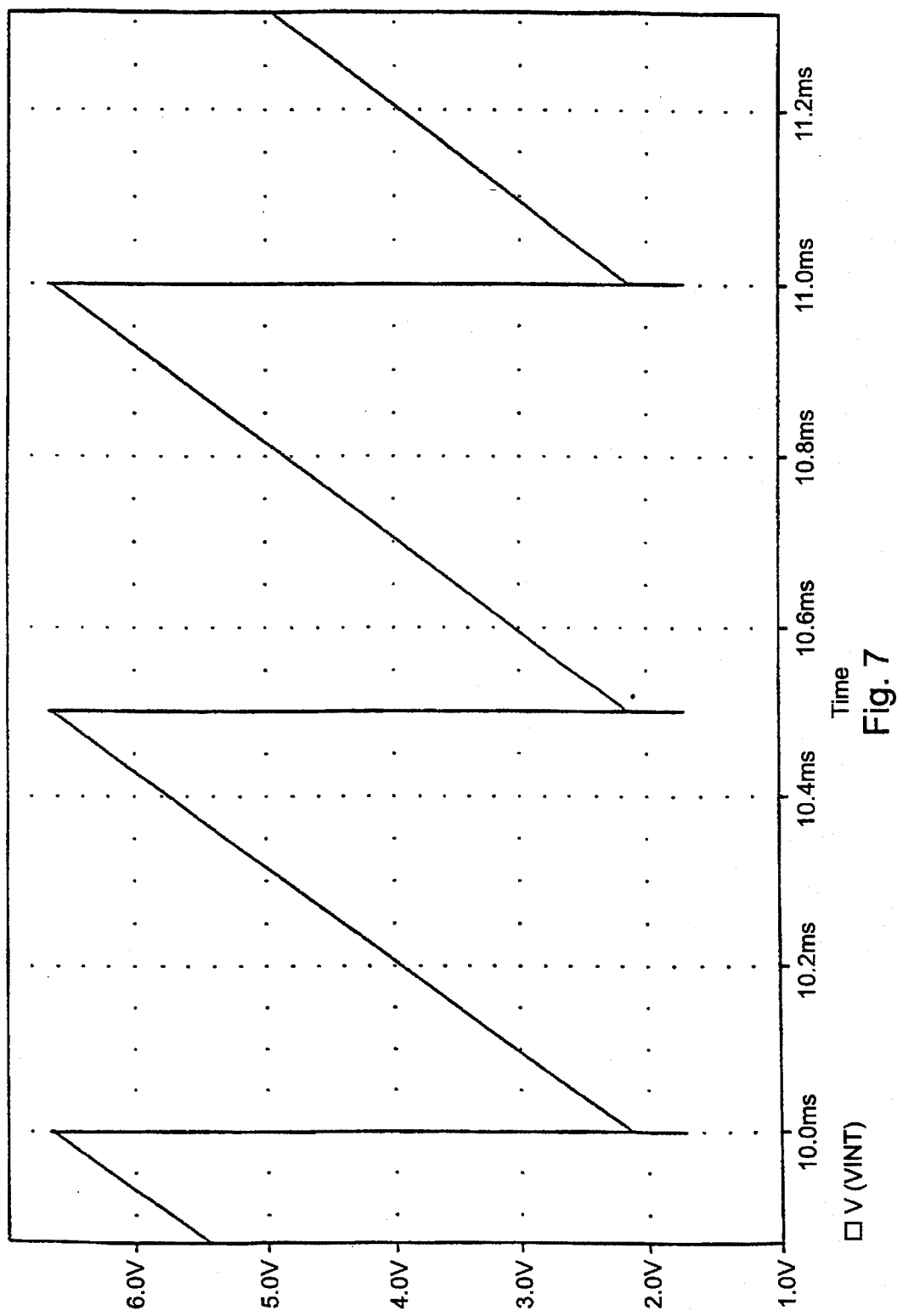

The waveforms established in the circuit of FIG. 5 are shown in FIGS. 6 and 7. FIG. 6 shows voltage as a function of time at a point A, and FIG. 7 is a graph showing the voltage as a function of time at a point B.

Figure 8:
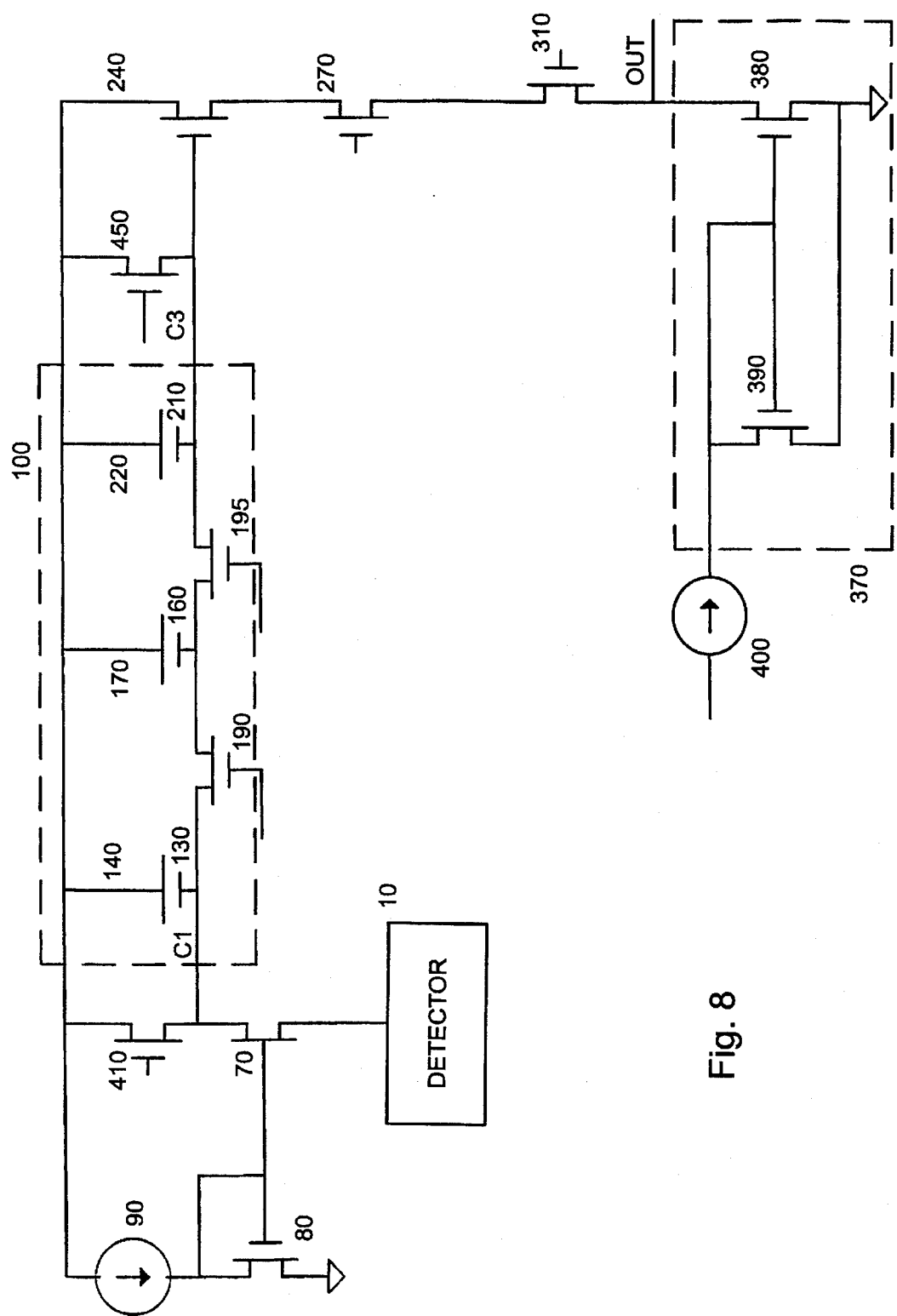
FIG. 8 is a circuit layout for one possible embodiment of a detector cell incorporating the present invention.
Figure 9:
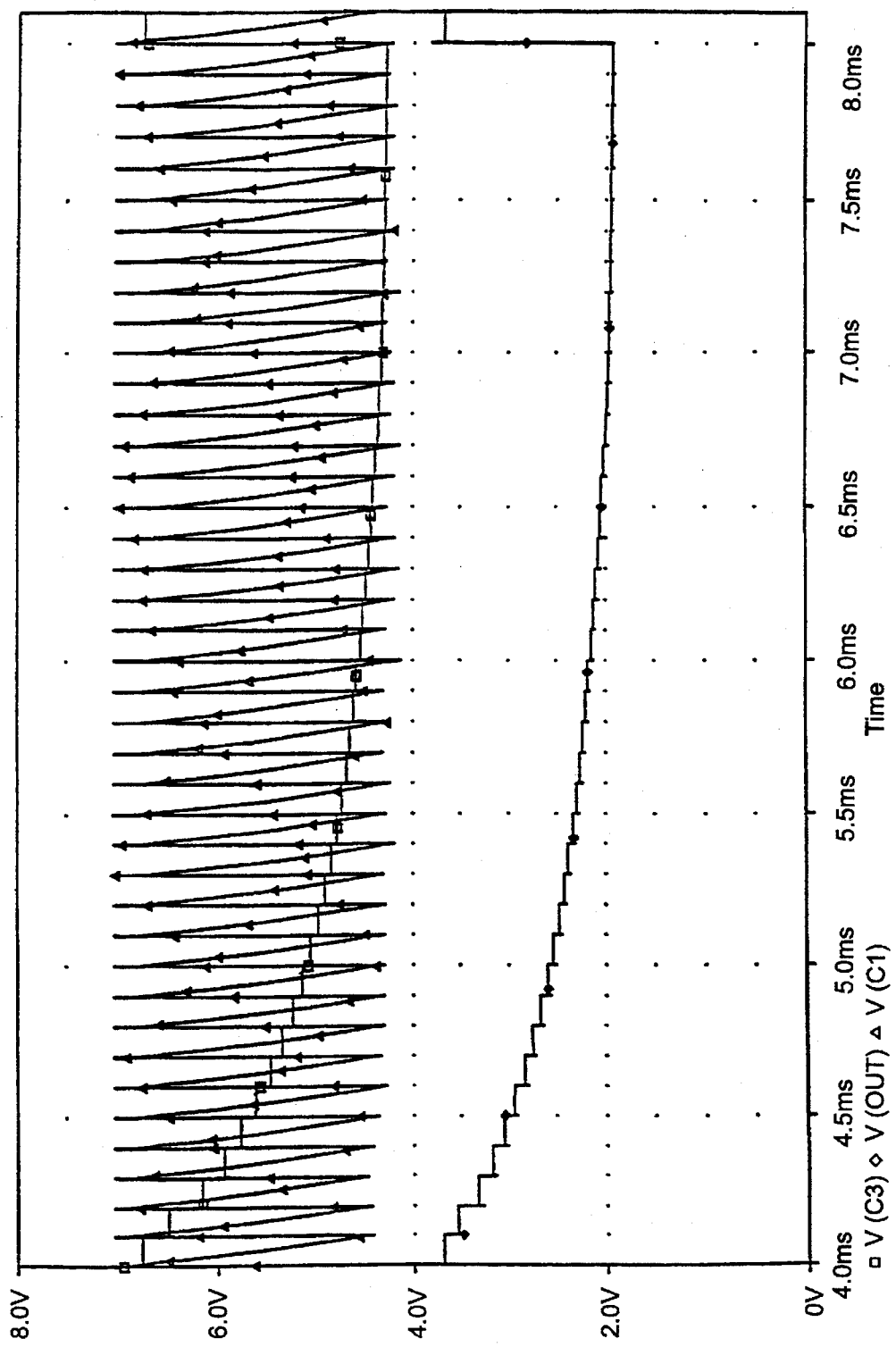
FIG. 9 shows waveforms as would occur at various points in the embodiment of FIG. 8.

FIG. 8 is a more complete rendering of an operational circuit. The buffer injector is depicted as including a pair of transistors 70 and 80 coupled with a current source 90. The low pass filter includes a charge well 130 which in the embodiment shown is the shielded gate of a transistor 140. The gate of this transistor is a glass capacitor which is an ideal charge well with respect to linearity, hysteresis, dissipation, and charge transfer efficiency. Shielding is provided by using the second polysilicon layer as a cover plate. The lower active rail is tied to the substrate which shields the other plate. Shielding is important in staring arrays to prevent cross talk. The value of this capacitor is computed by multiplying the width and length dimensions in micrometers by 2 femtofarads per square micrometers. A typical value for such a capacitor would be 0.5 pF.

The charge well 130 is connected to a pump storage well 160 by first charge transfer switch 190. The pump storage well 160 is the shielded gate of a transistor 170 in the embodiment shown. The first charge transfer switch 190 is a transistor. The voltage accumulated across the charge well transistor 130 is transferred to the pump storage well 160 by the first charge transfer switch 190. The charge pump storage well 160 is a capacitor similar to the charge well, but having a value on the order of, say, 0.05 pF.

The charge on the charge pump storage well 160 is transferred to the output filter well 210 using the output switch 195. Except for the deep well reset time period, the charge transfer switches 190 and 195 never overlap in conduction intervals. The noise filter capacitor is a deep well. The output well uses the shielded gate of transistor 220 as the filter capacitor. The total filter capacitance also uses the capacitance of the gate of cell buffer 240, which includes a transistor 450, to complete the charge well capacity.

A common drain circuit configuration is used for the cell buffer 240 due to its gain stability and speed. The transistor used as the cell buffer preferably has a relatively large transconductance. The back gate of this transistor is grounded but the non-linearities associated with this difficultly are mitigated by the large dark current and the matching of the cell row switch.

The buffered signal next passes to a row switch which in the embodiment shown comprises essentially a transistor 270. The row switch for the array is included inside the cell. This switch is matched to the cell buffer amplifier to maintain linearity.

The column switch 310 is remote from the cell. The output voltage appears at a node below the column switch 310. The output is buffered by an output buffer 370 which includes a pair of transistors 380 and 390. The purpose of the output buffer amplifier is to isolate the time division multiplexer bus from the output load. The current source for the cell amplifier is provided by current source 400. This current is set to achieve a reasonable slew rate response for the array.

The low pass filter also includes a reset switch 410 which resets the accumulator (charge well 130) in every cycle. The reset switch locally resets the capacitor and avoids passing the reset current through the power supply. This is a minimum area device which has about two thousand ohms of resistance when on and less than a femtofarad of overlap capacitance when the switch is off.

Other features such a self testing circuitry can also be provided. For example, an input voltage can be inserted to the charge well via a built-in test transistor. Such a device would allow a front end access without disturbing the input current.

A circuit such as that just described operates as follows. When photons strike the detector 10, a current is established. The buffer injector 40 attempts to keep the voltage across the detector constant despite the flow of current. This causes a charge to accumulate on charge well 130. The charge which accumulates on well 130 is transferred to the pump storage well 160 by operation of the first charge transfer switch 190. After this charge transfer operation is complete, the reset switch 410 resets the accumulator or charge well 130. The charge which has been transferred to the pump storage well 160 is in turn transferred to a capacitive structure formed by the shielded gate of transistor 220. This appears as an output signal which is buffered by the cell buffer 240. Row switch 270 and column switch 3 10 switch this signal into the main bus if the cell is being read with the output being buffered by output buffer 370.

Exemplary resulting waveforms are shown FIG. 4. The curve denoted by the open triangles shows the voltage at point C1 as indicated in FIG. 8 at the shielded gate of charge well 130. It should be noted that the well is reset every cycle. The waveform just upstream of cell buffer 240 indicated as point C3 is shown by the open squares. The open diamonds show the output voltage taken from the point indicated as "OUT" in FIG. 8.

It is also useful to examine operation of an arrangement according to the present invention in the frequency domain.

The Fourier transform of the dump, ramp, and sample current to voltage converter is a simple integral relationship. A rectangular function in the time domain transforms into a sinc function $$\text{sinc}(x) = \frac{\sin(\pi x)}{\pi x}$$

in the frequency domain. The Fourier transform of the sawtooth time domain waveform results in the following frequency domain relationship where f is the frequency variable in Hertz.

$$\frac{V_1(f)}{I_{in}(f)} = \frac{t_i}{C_w + C_R} \frac{\sin(\pi t_i f)}{\pi t_i f} \text{ ohms}$$

The nulls of this function are at frequencies, $f_n = k/t_i$ and $k = 0, 1, 2, \ldots n$. The frequencies fp are the frequencies where the peaks of the sin(x)/x function occur are located using k as an index. These frequencies are found at the following locations:

$$f_p = \frac{2k+1}{2t_i} \text{ Hertz}$$

where $k = 0, 1, 2, \ldots$ $f_p$ are the peak frequencies of the sin(x)/x function.

It is useful to identify the peaks of the sin(x)/x function to allow quick computation of subsequent filtering action. The current-to-voltage conversion equation for the sin(x)/x function peaks is found from the expression $$\frac{V_1(f_p,k)}{I_{IN}(f_p,k)} = \frac{t_i}{C_w + C_R} \cdot \frac{2*(-1)^k}{\pi(2k+1)} \text{ ohms}$$

where k is an integer such that k=0, 1, 2 . . .

Defining the edge of the passband at k=0 places the first peak at $$\frac{V_1(f_p,0)}{I_{IN}(f_p,0)} = \frac{t_i}{C_w + C_R} \cdot \frac{2}{\pi} \text{ ohms}$$

which is about 0.636 times the value at direct current.

Figure 10:
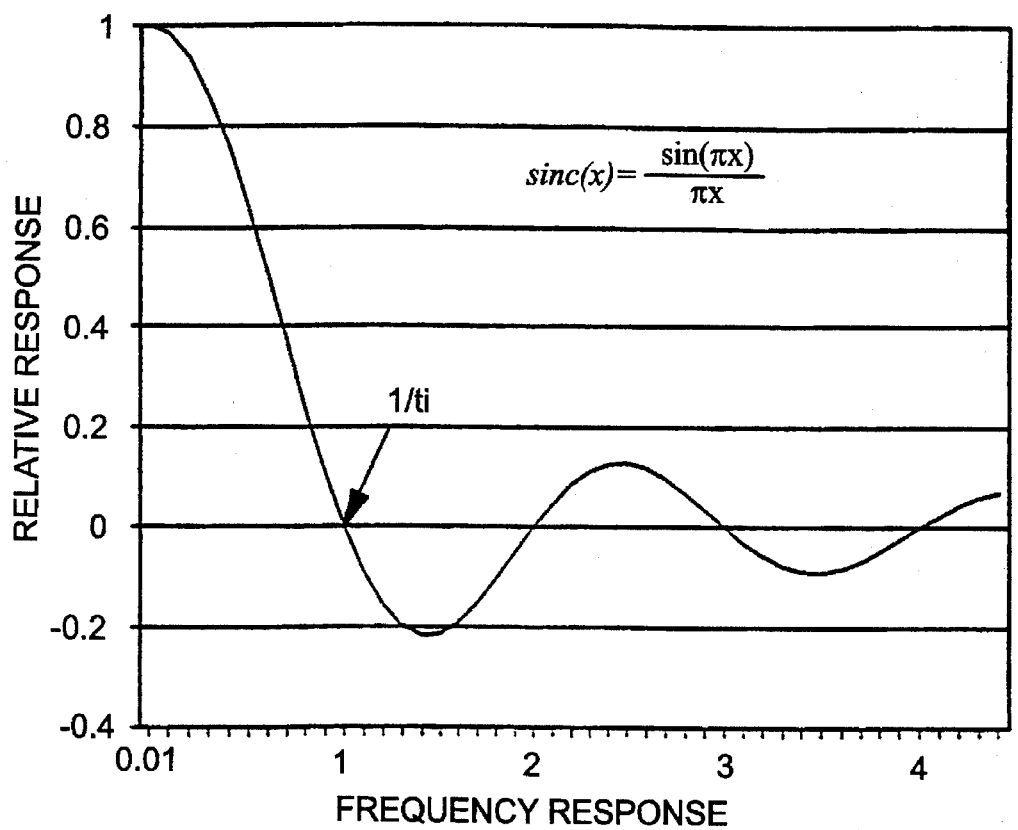
FIG. 10 is a graph showing a characteristic frequency response.

A relative frequency response plot showing the various peaks and nulls of the Fourier transform of the rectangular function is provided in FIG. 10. This figure is based on an integration period of one second. The first null of the sinc (sinx/x) function is marked as the frequency $1/t_i$ in Hertz.

The noise bandwidth is found by taking the root of the mean squared of the spectral response. The mean is found by integrating the magnitude square fourier transform for the process. This defines the noise power spectral density and the effective noise bandwidth.

For photovoltaic detectors, which are photon or shot noise limited in performance, the noise expression for the equivalent input noise has been defined by the equation $$<i_n> = \left( 2qI_D \int_0^\infty \frac{\sin^2(\pi f t_i)}{(\pi f t_i)^2} df \right)^{.5} \text{ amps rms}$$

where $I_D$ is the total detector current in amperes q is electron charge=$1.6*10^{-19}$ coulombs per electron f is the frequency in Hertz $<i_n>$ is the root mean squared value for the noise.

The equivalent noise bandwidth may be separated by identifying the mean of the magnitude squared spectral response as follows:

$$<i_n> = (2qI_D f_n)^{0.5} \text{ amps rms}$$

where the mean is $$f_n = \int_0^\infty \frac{\sin^2(\pi f t_i)}{(\pi f t_i)^2} df \text{ Hertz}$$

Let $x=\pi f t_i$ then as f approaches $\infty$, x also approaches $\infty$ and when f=0 then x=0 and $$\frac{dx}{\pi t_i} = df$$

Inserting these values and integrating yields $$f_n = \frac{1}{\pi t_i} \int_0^\infty \frac{\sin^2(\pi x)}{(\pi x)^2} dx = \frac{1}{\pi t_i} \cdot \frac{\pi}{2} = \frac{1}{2t_i} \text{ Hertz}$$

Inserting the equivalent noise bandwidth into the rms noise value for the first well operation yields the response $$<i_n> = (qI_D/t_i)^{.5} \text{ amp rms}$$

The first well has an electron capacity defined by the input current, the maximum voltage swing, and the capacitance of the well as follows $$qN_w = V_m(C_w + C_R) \text{ coulombs}$$

and $$t_i < \frac{qN_w}{I_D} \text{ seconds}$$

where $N_w$ is the number of stored electrons and $V_m$ is the maximum voltage for the storage capacitors The noise expression becomes $$<i_n> = I_D(1/N_w)^{0.5} \text{ amperes rms}$$

If the signal is defined as $I_D$ for background limited (BLIP) operation, then the signal to noise ratio is inversely proportional to the square root of the number of electrons stored. This is found from the above by $$\frac{I_D}{<i_n>} = \text{Signal/Noise} = N_w^{.5}$$

For photoconductors, which are generation-recombination noise limited, the expression for the noise carries the term $$<i_{npc}> = I_D(2g/N_w)^{.5} \text{ amperes rms}$$

where g is the photoconductive gain in electrons/electron.

It is important to note that g can be made less than 0.5 which can yield an advantage for quantum well detectors and photoconductors.

Now, for the capacity extending filter, the difference equation that describes the charge transfer is $$vpk(k)*(C_R+C_F)=v_1C_R=v(k-1)*C_f \text{ coulombs}$$

where v(k) is the voltage after the $k_{th}$ step and $v(k)*(C_R+C_F)$ is the charge after the $k_{th}$ step.

Collecting terms in the standard z-transform format, the difference equation becomes $$\frac{v(k)}{v_1} = \frac{C_R/(C_R+C_F)}{1 - z^{-1}C_F/(C_R+C_F)}$$

where $z^{-1}=e^{-jwti}=\cos \omega t_i - j \sin \omega t_i$ in the frequency domain and $v(k-1)=z^{-1}v(k)$ in the discrete z domain.

The frequency domain magnitude squared function for the power spectral density of the dump, ramp, sample function followed by the cup and bucket discrete filter is $$[H(f)]^2 = \frac{\sin^2(\pi f t_i)}{(\pi f t_i)^2} \cdot \frac{1}{(C_F/C_R+1)^2 + (C_F/C_R)^2 - 2(C_F/C_R)(C_F/C_R+1)\cos(2\pi f t_i)}$$

The above expression can be simplified by using the expansions $$\cos(x)=1-x^2/2$$

and $$\sin(x) = x$$

for small values of x.

The result of several steps of algebra yields the simplification for the noise bandwidth of $$f_n = \int_0^\infty \frac{1}{1 + (C_F/C_R + 1)(C_F/C_R)(2\pi f t_i)} \, df \text{ Hertz}$$

which is recognized as the inverse tangent expression. This expression evaluates to the form $$f_n = \frac{1}{4t_i(C_F/C_R + 1)^{.5}(C_F/C_R)^{.5}} \text{ Hertz}$$

which is the available noise bandwidth. Note that the noise bandwidth is set by capacitor ratios. This is an important consideration when practical filters are implemented based on the above theory.

Due to practical limitations that are imposed by parasitic capacitances, a practical capacitor ratio lies in the range of ten or twenty to one for readout electronic cells in the one to two mil (25 to 50 micron) sizes. Assuming the most conservative value to be ten to one, the noise bandwidth is considerably reduced by a factor of nearly 21. The term conservative refers to the ratio of the cup capacitance to the local switch capacitance. For the larger practical and less conservative ratio of twenty to one, the well depth is extended by almost double this factor and reaches about 41 times the original depth.

The half power or cutoff frequency, $f_c$, for the filter is found to be $$f_c = 2f_n/\pi \text{ Hertz}$$

The exact expression of the magnitude squared function for a ten to one capacitor ratio practical filter is $$[H(f)]^2 = \frac{\sin^2(\pi f t_i)}{(\pi f t_i)^2} \cdot \frac{1}{221 - 220\cos(2\pi f t_i)}$$

Figure 11:
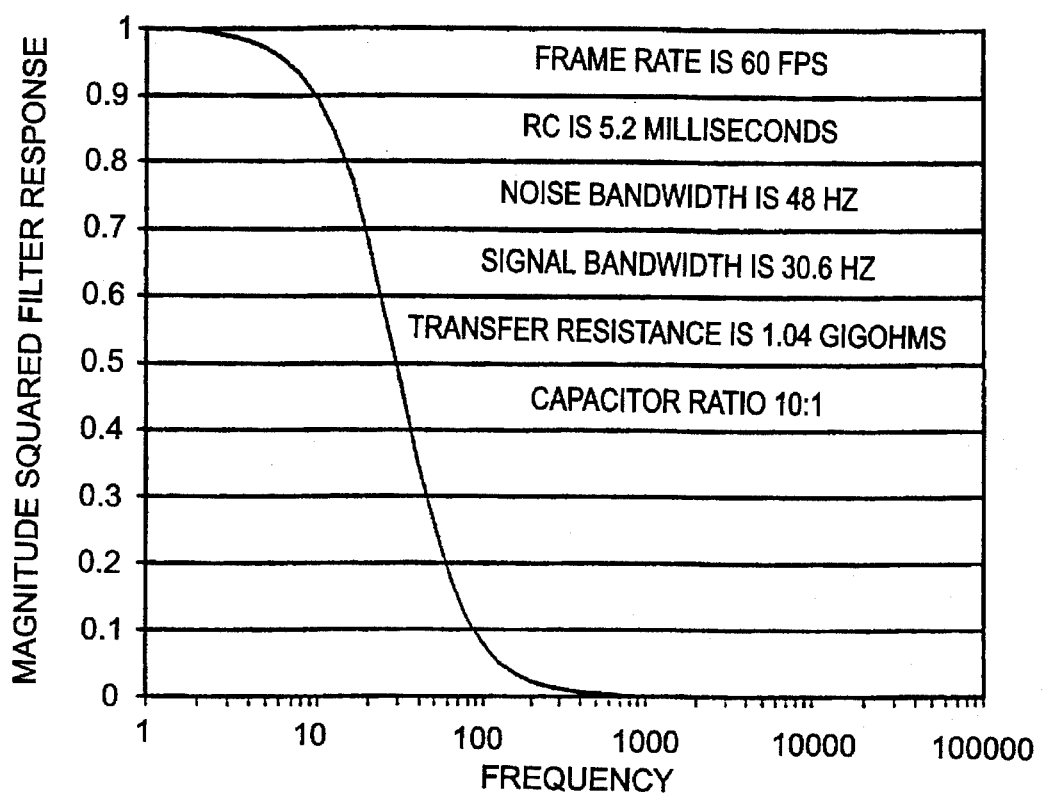
FIG. 11 is a graph showing filter response as a function of frequency.

FIG. 11 is a plot of this response where $t_i$ is set at 472 microseconds which has one out of band peak at $f_a = 1/(2t_i)$ of −39.9 dB. This filter will contain 64 samples at the cutoff frequency and the sampling tangential warping function will be limited to 5.4653 degrees at a ten to one capacitor ratio. This filter can effectively increase the well capacity by the following expression, which is based on the bandwidth decrease demonstrated.

$$\Re = 2*(C_F/C_R+1)^{0.5}(C_F/C_R)^{0.5}$$

where $\Re$ is the ratio by which the well capacity has been increased using the filter. For example, a 20:1 capacitor ratio yields an effective well depth increase of 40.988 times. As another example, given an integration time of 200 µseconds on the first well and a ten to one capacitor ratio, the effective signal bandwidth becomes 75.9 Hertz and the noise bandwidth is 119 Hertz. If the large capacitors are 0.5 picofarads at 5 volts, then the effective well depth is 327 million electrons.

It is important to note that the cup and first well can also be used as a subtractor circuit to reduce the noise bandwidth even more than the above example has indicated. The subtraction of leakage currents is a definite advantage for long integration time applications.

Quantum-well infrared photo-conducting staring arrays can be operated at 77 Kelvin using a detector cell according to the invention. Narrowing the noise bandwidth allows the long wave length infrared quantum well focal plane array to operate at higher temperatures without the use of an electromechanical chopper.

To achieve the noise equivalent temperature specified, the noise bandwidth must be less than:

$$f_n \leq <i^2_n>/(4gqI_{DC}) = 432 \text{ Hertz}$$

where g is the photoconductive gain.

This noise bandwidth would be impossible using standard single well charging techniques. For a 3 volt well voltage at the total detector current of 18.4 nanoamperes, the well capacity would have to be 21 picocoloumbs or 132 million electrons. The size of the integration capacitor would have to be greater than 7 picofarads. At two femtofarads per square, this would require nearly a sixty micron size for the cell. The technique described above allows the achievement of the narrowing the noise bandwidth by using a real steady state frequency response low pass noise filter. With this technique, the design develops as follows.

Using the deep well noise filtering technique it is convenient to lay out dual wells with a capacitance of 524 femtofarads per well. For a voltage swing of 4 volts at the leakage current specified, this results in a well capacity of 2.1 picocoulombs. The total swing available at the well is about 7 volts but there is some overhead required for the maximum target and array temperatures. At the specified total detector current, the available well sub-integration time is:

$$t_w = q_w/I_{DC} = 115 \text{ µseconds.}$$

The noise filter for the cell is a switched capacitor filter. The resistor in this low pass filter section has a resistance that is computed by the ratio of the well sub-integration time to the capacitance of the switched capacitor resistor. This resistor will have an equivalent resistance of:

$$R = t_w/C_R = 115 \text{ G}\Omega.$$

The capacitor for the noise filter is sized to be about the same as the transfer resistance cell capacitance. The time constant for the noise filter is calculated using the switched capacitor resistor and the value of the second well capacitance. The noise filter has a time constant of:

$$RC = 1.152 \text{ milliseconds.}$$

The cut-off frequency is computed by dividing the reciprocal of the time constant by two times pi. This value represents the edge of the signal pass band in the steady state frequency response of the noise filter:

$$f_C = 1/(2\pi RC) = 138 \text{ Hertz.}$$

The noise bandwidth for the cell is wider than the signal cut off frequency due to the noise energy in the "tails" of the steady state frequency response. This excess noise is found by multiplying the cut off frequency by pi and dividing by two. The resultant noise bandwidth for the multiplexer is:

$$f_n = 1/(4RC) = 217.1 \text{ Hertz}$$

which is greater than the maximum frame rate and less than the required noise bandwidth for the system. Hence, this is considered to be optimum.

The computed noise equivalent temperature for the system may now be estimated. The dominant noise mechanism is assumed to be the generation-recombination noise in the detector. The noise current is calculated first. Next, the noise equivalent temperature is calculated.

The dominant noise source for quantum wells is generation-recombination (G-R) noise. This noise is caused by the fluctuations in generation rates, recombination rates, or trapping rates in the photo-conductor thus causing fluctuations in the free carrier current concentration. The fluctuation in the rate of generation and recombination is affected by two processes, thermal excitation of carriers (hence colder has less noise) and photon excitation. The most commonly used expression for generation-recombination noise is:

$<i_n> = (4Gqi_pf_n)^{0.5} = 0.5622$ picoamperes.

Next, the noise equivalent temperature is found. This is found by taking the ratio of the temporal noise to the incremental photo-current with respect to temperature. This ratio is facilitated by the incremental photo-current gain.

$NE\Delta T = <i_n>/(\partial i_p/\partial T) = <i_n>T/(4i_p(T)) = 0.036$ Kelvin.

There will also be 1/f noise from the amplifier, and there will be additional system noise. In addition the system may have to operate with hotter background and array temperatures than the system specification would indicate.

The system transfer resistance gain is computed from the ratio of the well sub-integration time divided by the capacitance of the input well. It may also be found by dividing the input current into the selected well voltage.

$R_T = t_W/C_W = 212$ MegΩ.

It is interesting to note that the reciprocal of the product of the equivalent noise bandwidth and the transfer resistance yields the equivalent well depth for the deep well. The equivalent capacitance is:

$C_{eq} = 1/(R_T f_n) = 20.95$ picofarads.

This well saturates at 7.6 volts which results in a total well capacity for this system of:

$q_{eq} = V_m C_{eq} = 159.3$ pico-coulombs or the number of stored electrons is calculated by dividing the total equivalent charge by the electron charge $N_{eq} = q_{eq}/q = 0.996$ billion electrons.

where $N_{eq}$ is the noise equivalent electron storage.

The foregoing description will be understood as being merely illustrative of applicant's invention, and it is expected that changes and modifications will become apparent to those of ordinary skill in the art. Such changes and modifications that fall within the spirit and scope of the present invention and the following claims are intended to be included therein.

What is claimed is:

1. A device comprising:
   first means, arranged to receive a flux of photons, for generating a first current signal in response to said flux of photons;
   second means, responsive to said first current signal, for generating a first voltage signal in response to said first current signal, said second means including a switched capacitor low pass filter.

2. A device as claimed in claim 1 wherein said first means comprises a quantum efficient detector.

3. A device as claimed in claim 1 wherein said first means comprises a quantum well infrared photoconducting detector.

4. A device as claimed in claim 1 wherein said second means comprises a charge well transistor used as a charge accumulator.

5. A device as claimed in claim 4 further comprising means for resetting said charge accumulator each cycle.

6. A device comprising:
   first means, including a quantum well infrared photoconducting detector arranged to receive a photon flux, for generating a current signal having a magnitude indicative of an intensity of said photon flux; and
   means arranged to be charged by said current signal for generating a voltage signal as a result of being charged, said voltage signal having a magnitude indicative of said magnitude of said current signal, said means including a switched capacitor low pass filter.

7. A device comprising:
   first means, including a quantum well infrared photoconducting detector arranged to receive a photon flux, for generating a current signal having a magnitude indicative of an intensity of said photon flux;
   a first capacitive structure which is charged by said current signal;
   a second capacitive structure;
   a first transistor switch having a first conduction interval, said first transistor switch being arranged between said first capacitive structure and said second capacitive structure to transfer a charge accumulated by said first capacitive structure to said second capacitive structure;
   a third capacitive structure; and
   a second transistor switch having a second conduction interval having no substantial overlap with said first conduction interval, said second transistor switch being arranged between said second capacitive structure and said third capacitive structure to transfer a charge accumulated by said second capacitive structure to said third capacitive structure.

8. A device comprising:
   first means, including a quantum well infrared photoconducting detector arranged to receive a photon flux, for generating a current signal having a magnitude indicative of an intensity of said photon flux, said first means also including buffering means connected to said quantum well infrared photoconducting detector for maintaining a substantially constant voltage across said quantum well infrared photoconducting detector;
   a first charge well transistor having a gate connected to said buffering means, said gate forming a first capacitive structure which is charged by said current signal;
   a second charge well transistor;
   a first transistor switch having a first conduction interval, said first transistor switch being arranged between said gate of said first charge well transistor and a gate of said second charge well transistor to transfer a charge accumulated by said first capacitive structure to a second capacitive structure formed by said second charge well transistor;
   a third charge well transistor; and
   a second transistor switch having a second conduction interval having no substantial overlap with said first conduction interval, said second transistor switch being arranged between said gate of said second charge well transistor and a gate of said third charge well transistor to transfer a charge accumulated by said second capacitive structure to a third capacitive structure formed by said third charge well transistor.

9. A method comprising the steps of:
   generating a first current signal in response to a flux of photons;
   generating a first voltage signal in response to said first current signal using a switched capacitor low pass filter.

10. A method comprising the steps of:
    generating a current signal having a magnitude indicative of an intensity of a photon flux using a quantum well infrared photoconducting detector arranged to receive said photon flux; and generating a voltage signal as a result of charging by said current signal, said voltage signal having a magnitude indicative of said magnitude of said current signal, using a switched capacitor low pass filter.

\* \* \* \* \*

UNITED STATES PATENT AND TRADEMARK OFFICE
CERTIFICATE OF CORRECTION

PATENT NO. : 5,629,522

DATED : May 13, 1997

INVENTOR(S) : Robert J. MARTIN et al.

It is certified that error appears in the above-indentified patent and that said Letters Patent is hereby corrected as shown below:

Column 1, line 65, the equation should read:

$$f_n = \int_0^\infty \frac{\sin(\pi f t_i)}{\pi f t_i} df = \frac{1}{2} t_i \; Hertz$$

Column 3, line 60, change "flames" to --frames--.
Column 7, line 8, the equation should read:

$$t_i = \frac{1}{f_n} = 4RC_f \quad seconds$$

line 19, the equation should read:

$$t_i = \frac{4 V_m C_w C_f}{C_R I_{DC}} \quad seconds$$

UNITED STATES PATENT AND TRADEMARK OFFICE
CERTIFICATE OF CORRECTION

PATENT NO. : 5,629,522
DATED : May 13, 1997
INVENTOR(S) : Robert J. MARTIN et al.

It is certified that error appears in the above-indentified patent and that said Letters Patent is hereby corrected as shown below:

Column 10, line 53, change "fp" to --$f_p$--.
Column 12, line 31, the equation should read:

$$<i_{npc}> = I_D(2g/N_w)^{.5} \quad amperes\ rms$$

line 40, the equation should read:

$$v(k)*(C_R+C_F) = v_1 C_R = v(k-1)*C_f \quad coulombs$$

Signed and Sealed this

Ninth Day of September, 1997

BRUCE LEHMAN

Attesting Officer     Commissioner of Patents and Trademarks